United States Patent [19]

Kubo

[11] Patent Number: 4,639,500

[45] Date of Patent: * Jan. 27, 1987

[54] RESIN COMPOSITIONS CURABLE BY ACTIVE ENERGY RAYS

[75] Inventor: Motonobu Kubo, Iwakuni, Japan

[73] Assignee: Sanyo-Kokusaku Pulp Company, Limited, Tokyo, Japan

[*] Notice: The portion of the term of this patent subsequent to Dec. 3, 2002 has been disclaimed.

[21] Appl. No.: 635,269

[22] Filed: Jul. 27, 1984

[30] Foreign Application Priority Data

Feb. 3, 1984 [JP] Japan .................................. 59-19107

[51] Int. Cl.$^4$ .......................... C08F 2/50; C08F 20/28; C08F 20/40
[52] U.S. Cl. ...................................... 526/301; 522/18; 522/46; 522/96; 522/103; 522/107; 522/121; 525/59; 526/309
[58] Field of Search ...................... 204/159.23; 522/96, 522/103, 107, 121; 525/59; 526/301, 309

[56] References Cited

U.S. PATENT DOCUMENTS

| | | | |
|---|---|---|---|
| 3,730,947 | 5/1973 | Stoffey et al. | 560/220 |
| 3,770,602 | 11/1973 | D'Alelio | 204/159.15 |
| 4,439,291 | 3/1984 | Irving | 204/159.23 |
| 4,463,169 | 7/1984 | Irving | 204/159.23 |
| 4,556,729 | 12/1985 | Kubo et al. | 560/220 |

*Primary Examiner*—John C. Bleutge
*Assistant Examiner*—A. H. Koeckert
*Attorney, Agent, or Firm*—Oblon, Fisher, Spivak, McClelland & Maier

[57] ABSTRACT

A resin composition curable by active energy rays characterized in containing a compound represented by a following structural formula (I).

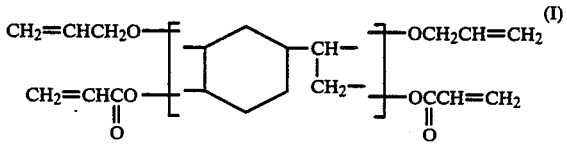

4 Claims, No Drawings

RESIN COMPOSITIONS CURABLE BY ACTIVE ENERGY RAYS

DETAILED DESCRIPTION OF THE INVENTION

The present invention relates to a resin composition which cures by the irradiation of so-called active energy rays such as ultraviolet rays, electron rays or the like, in particular, to a resin composition curable by active energy rays having an excellent curability.

Recently, the so-called resin compositions curable by active energy rays which cure by the irradiation of active energy rays are in course of being applied industrially to the painting, printing or the like on various plastics, metals, woods, papers, etc. from all sorts of advantages such as disuse of solvent, energy conservation, high-speed curing at low temperature, etc.

The resin composition curable by active energy rays used for these purposes contains generally (a) base resin and (b) reactive diluent as constitutional ingredients to form the film. Base resin (a) is also called prepolymer or oligomer and a compound having at least one of ethylenic unsaturated group in the molecule. This is mostly solid or extremely viscous liquid at ordinary temperature and has a property that the curing speed is low as it is. Since this property brings a remarkable difficulty in the runnability on coating and curing to the substrates, a polymerizable monomer called reactive diluent (b) is used to formulate for the improvement in this point. Two kinds of functions are required to this compound, that is, viscosity-reducing effect by formulating as a diluent and promotion of cure.

By the irradiation of active energy rays to the system as described above, the polymerization proceeds radically to form the cured film, but the method as this has a problem which is not completely interpreted today.

Namely, the molecular state oxygen has an inhibiting action against the radical polymerization in the system as this. Therefore, if the polymerization is conducted radically in the presence of the molecular oxygen, cured product having a satisfactory surface smoothness is not obtained as a rule hitherto, since the tackiness is left over for a long time on the surface touching to oxygen-(air).

In order to solve this point, many studies have been carried out up to this time. For example, a method, wherein curing is conducted in an atmosphere of inert gas such as nitrogen gas or the like, and a method, wherein base resin introduced a specific functional group capable of reacting with oxygen such as methyl-1,2,3,6-tetrahydrophthalic acid group, allyl ether group or the like is used, are known. Also, in the case of using ultraviolet rays as active energy rays, a method, wherein amine is formulated to the curable resin composition for the purpose of the promotion of cure in air, is proposed.

However, there are still many unsatisfactory points in these publicly known methods. Namely, in the method wherein the atmosphere at the curing time is displaced with inert gas, a special device is needed and the running cost also becomes expensive. In the method wherein base resin introduced the specific functional group is used, cured film furnished with the aimed physical properties is often difficult to obtain because of the restriction of base resin to be used. Moreover, in the method wherein amine is formulated to the system, such a case as the weather resistance is poor is experienced, because of the yellowing of cured film with the lapse of time etc.

On the background as this, the inventor has diligently studied on the resin system allowed to cure by the irradiation of active energy rays for the purpose of removing the defect as described above through the improvement in the cure hindrance due to oxygen and developing a resin composition curable by active energy rays having an excellent curability. As a result, the inventor has found that the above-mentioned purpose can be accomplished by using a compound (I) represented by following chemical formula, that is, 1(or 2)-acryloyloxy-2(or 1)-allyloxy-4[1(or 2)-acryloyloxy-2(or 1)-(allyloxy)ethyl]cyclohexane in place of or in combination with the conventional reactive diluent, leading to the completion of the invention.

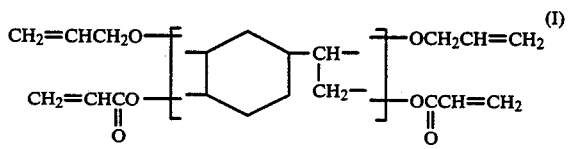
(I)

Compound (I) represented by above chemical formula (hereinafter this is abbreviated merely to as compound (I)) is a novel compound never found in the literature, and the inventor had formerly known that this was useful as material for the curable resin composition (Japan Patent Application No. 232112/1983), U.S. Pat. No. 4,556,729.

The present invention is one based on this knowledge, and provides a resin composition curable by active energy rays formulated with the compound (I) as the reactive diluent.

In the invention, the base resin may have a polymerizable ethylenic unsaturated group. For example, as representative ones, (a) polyester-based polyvalent vinyl compound obtained through the condensation oligomerization of polyvalent alcohol with polyvalent carboxylic acid and ethylenic unsaturated monocarboxylic acid, (b) epoxy-based polyvalent vinyl compound allowed polyvalent epoxy compound to add ethylenic unsaturated carboxylic acid, (c) polyurethane-based polyvalent vinyl compound derived through the addition reaction of polyvalent isocyanate with hydroxyl group containing ethylenic unsaturated monomer, and the like can be mentioned. These compounds can be used not only solely but also in a mixed form of more than two.

When using ultraviolet rays as active energy rays to irradiate for curing, a photopolymerization initiator is necessary. This may be selected arbitrarily from publicly known initiators which generate radicals by the irradiation of ultraviolet rays such as benzophenone, benzyl, o-benzoylbenzoic acid, o-benzoylmethylbenzoate, etc.

As the reactive diluents, acrylic acid esters, that is, tetrahydrofurfuryl acrylate, trimethylolpropane triacrylate, diethyleneglycol diacrylate, neopentylglycol diacrylate, 1,6-hexanediol diacrylate, etc. are used conventionally.

Compound (I) in the invention can be used in place of or in combination with these conventional reactive diluents. Since compound (I) has allyl ether groups, the curability of the surface is improved by using this. Furthermore, the invention has an excellent advantage that it is possible to obtain the cured film furnished with the aimed physical properties easily, since the types of base resins used have fewer restrictions and a greater degree of freedom compared to a method using base resin introduced allyl ether group as known hitherto.

The manufacturing method of the compound (I) described above is exemplified below for reference.

Compound (I) can be obtained by esterifying a compound represented by following structural formula (II) obtained through the ring-opening of the oxirane ring of 4-vinylcyclohexene dioxide in the presence of allyl alcohol, that is, 1(or 2)-allyloxy-2(or 1)-hydroxy-4[1(or 2)-allyloxy-2(or 1)-(hydroxy)ethyl]cyclohexane, with acrylic acid or its derivative.

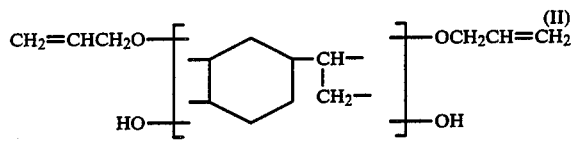

When esterification is conducted using acrylic acid, either sulfuric acid or p-toluenesulfonic acid may be used as a catalyst. Moreover, as polymerization inhibitors used in the reaction process, those which can be easily removed by washing with aqueous solution of alkali such as hydroquinone, hydroquinone monomethyl ether, cuprous chloride, etc. are preferable.

As azeotropic solvents to be used for taking the water formed through the esterification reaction outside the system, organic solvents which form azeotropic mixtures with water and are immiscible substantially with water each other such as benzene, toluene, xylene, n-hexane, methyl isobutyl ketone, etc. can be employed either solely or in a mixed form.

Compound (I) is also possible to be manufactured through the transesterification between acrylic acid ester and compound (II). In this case, publicly known acrylic acid esters such as methyl-, ethyl-, butyl-, n-propyl- and iso-propylacrylate are heated with compound (II) in the presence of the polymerization inhibitor and the catalyst, and transesterification is conducted by taking said lower alcohol formed outside the system.

With regard to the polymerization inhibitors in this case, hydroquinone, hydroquinone monomethyl ether, etc. are used, if sulfuric acid or p-toluenesulfonic acid is used as a catalyst for transesterification, but alkaline polymerization inhibitors, for example, p-phenylenediamine and phenyl-β-naphthylamine are used, if alkaline catalysts such as metallic sodium, sodium alcoholate, etc. are used.

In following, the invention will be further explained concretely using examples and comparative examples. However, the invention is not confined by these examples. Besides, "parts" in examples and comparative examples mean parts by weight.

EXAMPLE 1

Resin composition curable by active energy rays ① was manufactured using a formulation shown below.

| | |
|---|---|
| Oligoester acrylate (M-6240X, made by Toa Synthetic Chemical Industries, Co.) | 60 parts |
| Neopentylglycol diacrylate | 20 parts |
| Compound (I) | 20 parts |
| | 100 parts |

Composition ① was coated on lauan plywood with filling treatment by the use of bar coater so as to obtain a thickness of 30μ, and irradiated with electron rays of 5 Mrad at 150 KV and 5 mA in air. The coated layer cured completely and no tackiness was observed on the surface.

COMPARATIVE EXAMPLE 1

The same procedure was employed as Example 1 except that compound (I) was substituted with trimethylolpropane triacrylate in the composition of Example 1. It was necessary to conduct the irradiation in a nitrogen atmosphere in order to obtain an equal cure state as that in Example 1.

EXAMPLE 2

Resin composition curable by ultraviolet rays 2 was manufactured using a formulation shown below.

| | |
|---|---|
| Oligoester acrylate (M-6200, made by Toa Synthetic Chemical Industries, Co.) | 60 parts |
| Neopentylglycol diacrylate | 16 parts |
| Compound (I) | 20 parts |
| O—Benzoylmethylbenzoate | 4 parts |
| | 100 parts |

Composition ② was coated on printed paperboard for fancy boxes so as to obtain a coating weight of 15 g/m². When irradiated for 4 seconds from a position having a height of 12 cm by using high-voltage mercury lamp (80 W/cm), the coated layer cured completely and no tackiness was observed on the surface.

COMPARATIVE EXAMPLE 2

The same procedure was employed as Example 2 except that compound (I) was substituted with trimethylolpropane triacrylate in the composition of Example 2. It was necessary to add further 1 part of triethylenetetramine to 100 parts of this composition in order to obtain an equal cure state as that in EXAMPLE 2.

From the comparison of Example 1 with Comparative example 1, it is evident that the problem of the cure hindrance due to oxygen can be solved, if using compound (I).

Also, from the comparison of Example 2 with Comparative example 2, it is evident that sufficient cure performance can be accomplished without the addition of amine, if using compound (I).

From results described above, the effectiveness of the invention is obvious.

What is claimed is:

1. A resin composition curable by active energy rays which comprises:
   (A) A base resin having a polymerizable ethylenic unsaturated group; and
   (B) A reactive diluent having the formula (I):

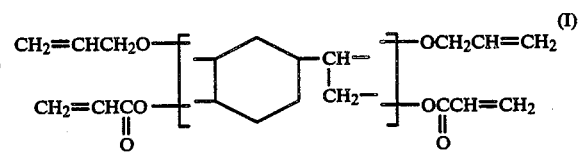

2. The resin composition according to claim 1, further comprising an acrylic acid ester diluent selected from the group consisting of tetrahydrofurfuryl acrylate, trimethylolpropane triacrylate, diethyleneglycol diacrylate, neopentylglycol diacrylate, and 1,6-hexanediol diacrylate.

3. The resin composition according to claim 1, wherein said reactive diluent of the formula (I) is used in the amount of about 20 parts by weight based on the total resin composition weight.

4. The resin composition according to claim 1, wherein said base resin is selected from the group consisting of (a) a polyester based polyvinyl compound obtained by the condensation oligomerization of a polyvinyl alcohol with a polyvalent carboxylic acid and an ethylenically unsaturated monocarboxylic acid, (b) an epoxy-based polyvalent vinyl compound obtained by reacting a polyvalent epoxy compound with an ethylenically unsaturated carboxylic acid, or (c) a polyurethane-based polyvalent vinyl compound obtained by the addition reaction of a polyvalent isocyanate with a hydroxyl group-containing ethylenically unsaturated monomer.

* * * * *